US011830553B2

(12) United States Patent
Yang

(10) Patent No.: US 11,830,553 B2
(45) Date of Patent: Nov. 28, 2023

(54) WORD LINE DRIVE CIRCUIT AND DYNAMIC RANDOM ACCESS MEMORY

(71) Applicant: CHANGXIN MEMORY TECHNOLOGIES, INC., Hefei (CN)

(72) Inventor: Cheng-Jer Yang, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 54 days.

(21) Appl. No.: 17/412,363

(22) Filed: Aug. 26, 2021

(65) Prior Publication Data

US 2022/0130460 A1    Apr. 28, 2022

Related U.S. Application Data

(63) Continuation of application No. PCT/CN2021/099504, filed on Jun. 10, 2021.

(30) Foreign Application Priority Data

Oct. 23, 2020    (CN) .......................... 202011146047.0

(51) Int. Cl.
  *G11C 16/08*   (2006.01)
  *H03K 3/015*   (2006.01)
  *G11C 16/30*   (2006.01)
  *G11C 16/04*   (2006.01)

(52) U.S. Cl.
  CPC .......... *G11C 16/08* (2013.01); *G11C 16/0433* (2013.01); *G11C 16/30* (2013.01); *H03K 3/015* (2013.01)

(58) Field of Classification Search
  CPC .......... G11C 16/08; G11C 16/06; G11C 8/08; G11C 8/10; G11C 8/14; G11C 8/18; G11C 11/408; G11C 11/4085
  See application file for complete search history.

(56) References Cited

U.S. PATENT DOCUMENTS

| 7,023,758 | B2 | 4/2006 | Hanson |
| 7,046,572 | B2 | 5/2006 | Hanson |
| 7,746,721 | B2* | 6/2010 | Chan ........................ G11C 8/10 |
| | | | 365/230.06 |
| 8,045,394 | B2* | 10/2011 | Do ......................... G11C 29/02 |
| | | | 365/185.23 |
| 9,552,866 | B2 | 1/2017 | Mochida |
| 9,922,726 | B2 | 3/2018 | Choi |

(Continued)

FOREIGN PATENT DOCUMENTS

| CN | 1799103 A | 7/2006 |
| CN | 104050999 A | 9/2014 |

(Continued)

*Primary Examiner* — Kretelia Graham
(74) *Attorney, Agent, or Firm* — Cooper Legal Group, LLC

(57) ABSTRACT

The application provides a Word Line (WL) drive circuit and a Dynamic Random Access Memory (DRAM). The WL drive circuit includes a first transistor, a second transistor, a third transistor and a fourth transistor. A gate of the first transistor is connected to a WL switch-off voltage, a drain is connected to the WL; a gate of the second transistor is connected to a first drive voltage of the WL, a drain is connected to the WL; and a source of the first transistor and a source of the second transistor are both connected to a negative bias through the third transistor.

10 Claims, 2 Drawing Sheets

(56) References Cited

U.S. PATENT DOCUMENTS

| | | | |
|---|---|---|---|
| 10,115,450 B1 | 10/2018 | DeBrosse et al. | |
| 10,332,584 B2 | 6/2019 | Mochida | |
| 11,244,716 B2* | 2/2022 | Jeong | G11C 29/81 |
| 2004/0252573 A1 | 12/2004 | Hanson | |
| 2006/0039226 A1 | 2/2006 | Hanson | |
| 2011/0228624 A1* | 9/2011 | Kim | G11C 8/14 |
| | | | 365/230.06 |
| 2015/0255146 A1 | 9/2015 | Mochida | |
| 2017/0103798 A1 | 4/2017 | Mochida | |
| 2017/0178751 A1 | 6/2017 | Choi | |
| 2023/0017400 A1* | 1/2023 | Wang | G11C 11/4085 |
| 2023/0026502 A1* | 1/2023 | Wang | G11C 8/08 |

FOREIGN PATENT DOCUMENTS

| | | |
|---|---|---|
| CN | 110148433 A | 8/2019 |
| CN | 111261202 A | 6/2020 |
| KR | 20110059124 A | 6/2011 |

\* cited by examiner

WORD LINE DRIVE CIRCUIT AND DYNAMIC RANDOM ACCESS MEMORY

CROSS-REFERENCE TO RELATED APPLICATIONS

This is a continuation application of International Patent Application No. PCT/CN2021/099504, filed on Jun. 10, 2021, which claims priority to Chinese Patent Application No. 202011146047.0, filed on Oct. 23, 2020 to State Intellectual Property Office of China and entitled "WORD LINE DRIVE CIRCUIT AND DYNAMIC RANDOM ACCESS MEMORY". The disclosures of International Patent Application No. PCT/CN2021/099504 and Chinese Patent Application No. 202011146047.0 are hereby incorporated by reference in their entireties.

BACKGROUND

At present, Dynamic Random Access Memories (DRAMs) have been widely applied to various electronic products by virtue of low cost and high density.

An existing DRAM generally consists of a plurality of memory units, and each of the memory units corresponds to and is coupled to a Word Line (WL). A voltage of each WL is controlled by a WL drive circuit corresponding to the WL.

SUMMARY

Embodiments of the present disclosure relate to the technical field of semiconductors, and in particular to a Word Line (WL) drive circuit and a Dynamic Random Access Memory (DRAM).

The Embodiments of the disclosure provide a WL drive circuit and a DRAM, to reduce the leakage current generated in the WL drive circuit, and further to reduce the power consumption of the DRAM.

In a first aspect, an embodiment of the disclosure provides a WL drive circuit. The WL drive circuit includes a first transistor, a second transistor, a third transistor and a fourth transistor. A gate of the first transistor is connected to a WL switch-off voltage, and a drain of the first transistor is connected to a WL. A gate of the second transistor is connected to a first drive voltage of the WL, and a drain of the second transistor is connected to the WL. A source of the first transistor and a source of the second transistor are both connected to a negative bias through the third transistor. A drain of the fourth transistor is connected to the WL, a source of the fourth transistor is connected to a second drive voltage of the WL, and a gate of the fourth transistor is connected to the WL switch-off voltage.

In a second aspect, an embodiment of the disclosure provides a DRAM. The DRAM includes a WL and a WL drive circuit. The WL drive circuit includes a first transistor, a second transistor, a third transistor and a fourth transistor, and the WL drive circuit is connected to the WL. A gate of the first transistor is connected to a WL switch-off voltage, and a drain of the first transistor is connected to the WL. A gate of the second transistor is connected to a first drive voltage of the WL, and a drain of the second transistor is connected to the WL. A source of the first transistor and a source of the second transistor are both connected to a negative bias through the third transistor. A drain of the fourth transistor is connected to the WL, a source of the fourth transistor is connected to a second drive voltage of the WL, and a gate of the fourth transistor is connected to the WL switch-off voltage.

BRIEF DESCRIPTION OF THE DRAWINGS

In order to describe the embodiments of the disclosure or the technical solutions in the related art more clearly, the drawings used in the embodiments of the disclosure or in the related art will be simply introduced below. It is apparent that the drawings described below are only some embodiments of the disclosure. Other drawings may be obtained by those of ordinary skill in the art according to these drawings without paying inventive efforts.

DETAILED DESCRIPTION

Figure 1:
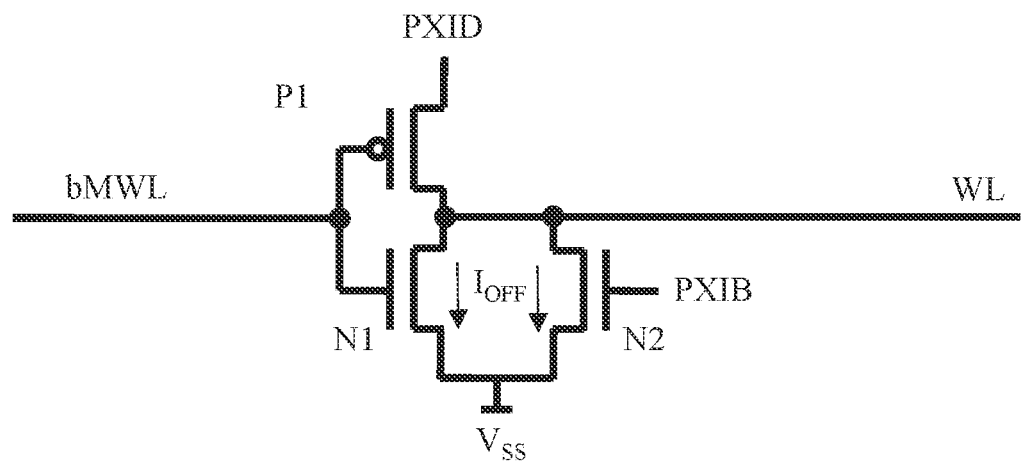
FIG. 1 shows a structure diagram of a WL drive circuit in the related art.

In order to make objective, technical solutions and advantages of the embodiments of the disclosure clearer, the technical solutions in the embodiments of the disclosure will be clearly and completely described below in combination with the drawings in the embodiments of the disclosure. It is apparent that the described embodiments are not all of the embodiments but some of embodiments of the disclosure. All other embodiments obtained by those of ordinary skill in the art on the basis of the embodiments in the disclosure without paying inventive efforts shall fall within the scope of protection of the disclosure.

In existing transistor production technologies, taking a Negative channel Metal Oxide Semiconductor (NMOS) transistor as an example, a grid oxide layer is generally formed on a semiconductor substrate and a grid conductive layer (also called gate electrode layer) is formed on the grid oxide layer. Then a gate is formed by etching the grid conductive layer and the grid oxide layer, next, a source region and a drain region are formed in the substrate on two sides of the gate through ion implantation. In such way, the NMOS transistor is formed.

When a voltage is applied to the gate of the NMOS transistor, a conductive channel will be generated between the source region and the drain region. Moreover, a potential difference is generated between the source region and the drain region, and therefore a current will be generated between the source region and the drain region. The grid oxide layer may be used for insulation and isolation, to prevent the leakage current from being generated between the gate and the source region, and between the gate and the drain region.

However, with the rapid development of the semiconductor production technologies, integration of semiconductor wafers becomes higher. A critical size of the gate of the NMOS transistor is gradually reduced, the gate becomes shorter and narrower, and the conductive channel between the source region and the drain region that are in the semiconductor substrate under the gate becomes shorter and narrower as well. Consequently, a leakage current flowing from the drain region to the semiconductor substrate or the source region may be increased, which may result in reduced performance of a semiconductor device.

The existing DRAM may generally include a plurality of memory units that are arranged in a matrix manner, a plurality of WLs that are transversely arranged and a plurality of bit lines that are longitudinally arranged. Each memory unit may generally include a capacitor and a transistor. A gate of the transistor is connected to a WL, a drain is connected to a bit line, and a source is connected to the capacitor. A voltage signal on the WL may control the transistor to turn on/off, further, data information stored in the capacitor may be accessed through the bit line, or may be written into the capacitor through the bit line for storage.

The control gate of the each memory unit is electrically connected to a WL drive circuit through the WL, the other end of the WL drive circuit is connected to a WL selecting circuit, and a voltage of each WL is controlled by the WL drive circuit corresponding to the WL.

In a reading operation, a channel region of a corresponding memory unit on one bit line is turned on generally by using the WL selecting circuit, and a bit line voltage rises or falls to a specific voltage by the memory unit, the bit line voltage corresponding to storage information stored in the memory unit. The specific voltage is compared with a reference voltage, to determine whether the corresponding memory unit is logical "1" or logical "0".

The voltage signal on the WL may control the transistor to turn on/off, further, the data information stored in the capacitor is accessed through the bit line, or the data information is written into the capacitor through the bit line for storage.

The WL drive circuit generally includes two transistors. When the WL drive circuit is in the active mode, the transistor may generate the leakage current inevitably, and power consumption of the DRAM may be increased accordingly.

FIG. 1 is a structure diagram of a WL drive circuit in the related art. The WL drive circuit may include two NMOS transistors, i.e., a first NMOS transistor N1 and a second NMOS transistor N2, and a Positive channel Metal Oxide Semiconductor (PMOS) transistor P1.

A drain of the PMOS transistor P1 is connected to a WL, to drive a memory array connected to the WL. A source of the PMOS transistor P1 is connected to a second drive voltage PXID of the WL. A gate of the PMOS transistor P1 is connected to a WL switch-off voltage bMWL, and the WL switch-off voltage bMWL is taken as a control voltage of the gate of the PMOS transistor. On or off of the WL may be controlled by controlling on or off of the second drive voltage PXID.

A gate of the first NMOS transistor N1 is connected to the WL switch-off voltage bMWL, and the WL switch-off voltage bMWL is taken as a control voltage of the gate of the first NMOS transistor. A drain of the first NMOS transistor N1 is connected to the WL, and a source of the first NMOS transistor is connected to a negative bias (or a negative potential) $V_{SS}$. The negative bias $V_{SS}$ is output to the WL through the source and the drain of the first NMOS transistor N1, and may be configured to turn off the WL.

A gate of the second NMOS transistor N2 is connected to a first drive voltage PXIB of the WL, and the first drive voltage PXIB is a WL switch-on switch and may control the gate of the second NMOS transistor N2. A drain of the second NMOS transistor N2 is connected to the WL, and a source of the second NMOS is connected to the negative bias $V_{SS}$. The negative bias $V_{SS}$ is output to the WL through the source and the drain of the second NMOS transistor N2, and may be configured to turn off the WL.

The WL drive circuit may generally operate in three modes: an active mode, a sleep mode and a power down mode. When the WL drive circuit is in the active mode, the second drive voltage PXID is at a high potential, the WL switch-off voltage bMWL is at a low potential, and the PMOS transistor P1 is in an on state. In this condition, the first NMOS transistor N1 and the second NMOS transistor N2 are in an off state, a voltage difference may be generated between the source region and the drain region of the first NMOS transistor N1 and between the source region and the drain region of the second NMOS transistor N2. Therefore, a leakage current $I_{OFF}$ is generated from the drain regions to the source regions.

Figure 2:
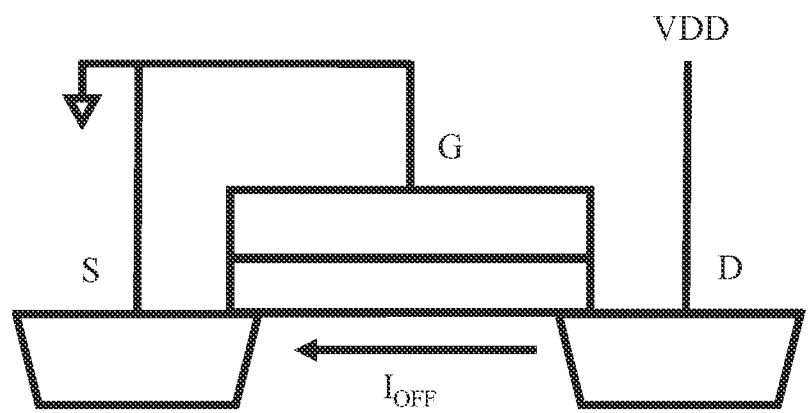
FIG. 2 shows a schematic diagram of a path of a leakage current $I_{OFF}$ generated in the related art.

Referring to FIG. 2, FIG. 2 schematically shows a path of the leakage current $I_{OFF}$ generated in an embodiment of the disclosure the related art.

In FIG. 2, for a transistor, when a gate G and a source S of the transistor are grounded and a drain D is connected to an operating voltage VDD, the leakage current $I_{OFF}$ may be generated in the transistor. Moreover, with a channel length of a transistor device decreasing, the leakage current $I_{OFF}$ may become larger.

In order to solve the above technical problem, the embodiments of the disclosure provide a novel WL drive circuit, and the WL drive circuit may be applied to a DRAM. A third transistor is added in the existing WL drive circuit, a source of the third transistor is connected to a negative bias, and a drain of the third transistor is connected to the source of the first transistor and the source of the second transistor, i.e., the source of the first transistor and the source of the second transistor are connected to the negative bias through the third transistor, rather than directly connected to the negative bias. In such way, when the WL drive circuit is in the active mode, the leakage current generated by the first transistor and the second transistor can be effectively reduced, and the power consumption of the DRAM can be reduced accordingly.

Figure 3:
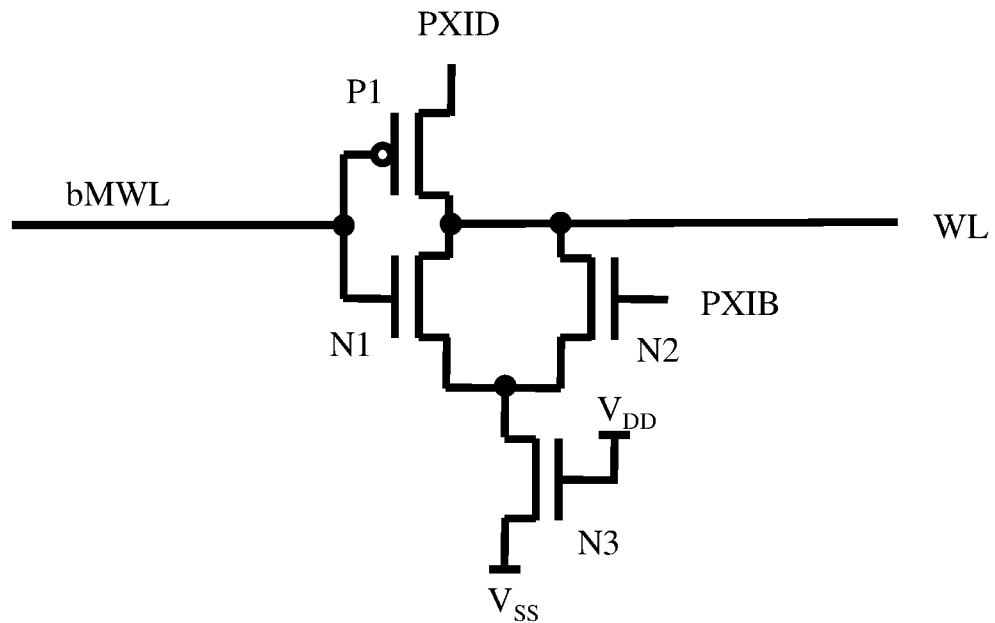
FIG. 3 shows a structure diagram of a WL drive circuit provided in an embodiment of the disclosure.

Specifically, referring to FIG. 3, FIG. 3 is a structure diagram of a novel WL drive circuit provided in an embodiment of the disclosure. In a possible implementation, the WL drive circuit may include a first transistor N1, a second transistor N2, a third transistor N3 and a fourth transistor P1.

A gate of the first transistor N1 is connected to a WL switch-off voltage bMWL, and the WL switch-off voltage bMWL is taken as a control voltage of the gate of the first transistor. A drain of the first transistor N1 is connected to the WL, and a source of the first transistor is connected to a drain of the third transistor N3.

A gate of the second transistor N2 is connected to a first drive voltage PXIB of the WL, the first drive voltage PXIB is a WL switch-on switch and may control the gate of the second transistor N2. A drain of the second transistor N2 is connected to the WL, and a source of the second transistor is connected to the drain of the third transistor N3.

A source of the third transistor N3 is connected to a negative bias $V_{SS}$, and a gate of the third transistor is connected to a power supply VDD.

The negative bias $V_{SS}$ is input to the source of the first transistor N1 through the third transistor N3, and then is output to the WL through the source and the drain of the first transistor N1. The negative bias $V_{SS}$ is input to the source of the second transistor N2 through the third transistor N3, and then is output to the WL through the source and the drain of the second transistor N2.

A drain of the fourth transistor P1 is connected to the WL, to drive a memory array connected to the WL. A source of the fourth transistor P1 is connected to a second drive voltage PXID of the WL. A gate of the fourth transistor P1 is connected to the WL switch-off voltage bMWL, and the WL switch-off voltage bMWL is taken as a control voltage of the gate of the fourth transistor. On or off of the WL may be controlled by controlling on or off of the second drive voltage PXID.

In the embodiment of the disclosure, when the WL drive circuit is in an active mode, normally, the WL switch-off voltage bMWL is at a low potential, the second drive voltage PXID is at a high potential, the first drive voltage PXIB is at a low potential, and an output of the WL is at a high potential.

The source of the first transistor N1 and the source of the second transistor N2 are both connected to the drain of the third transistor N3, and the source of the third transistor N3 is connected to the negative bias $V_{SS}$, therefore, in the active mode, the first transistor N1 and the second transistor N2 each may form a cascade structure with the third transistor N3. In such way, the third transistor N3 is equivalent to a resistor, the leakage current of the first transistor N1 and the second transistor N2 can be reduced.

Optionally, the first transistor N1, the second transistor N2 and the third transistor N3 are NMOS transistors, and the fourth transistor P1 is a PMOS transistor.

In the WL drive circuit provided in the embodiment of the disclosure, the source of the first transistor N1 and the source of the second transistor N2 are connected to the negative bias through the third transistor N3, rather than directly connected to the negative bias, the gate of the third transistor N3 is connected to the power supply. In the active mode, the first transistor N1 and the second transistor N2 each may form the cascade structure with the third transistor N3. In this way, the leakage current generated by the first transistor N1 and the second transistor N2 can be effectively reduced, and the power consumption of the DRAM can be reduced accordingly.

Figure 4:
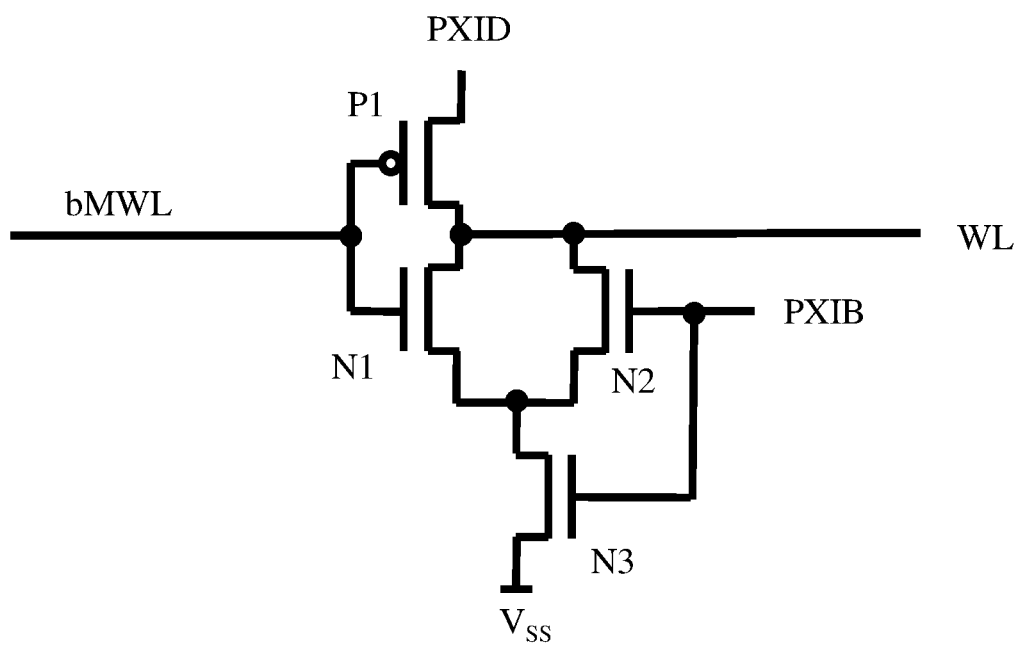
FIG. 4 shows a structure diagram of another WL drive circuit provided in an alternative embodiment of the disclosure.

Based on description disclosed in the abovementioned embodiments, referring to FIG. 4, FIG. 4 is a structure diagram of another novel WL drive circuit provided in an embodiment of the disclosure. In a possible implementation, the WL drive circuit may include a first transistor N1, a second transistor N2, a third transistor N3 and a fourth transistor P1.

A gate of the first transistor N1 is connected to a WL switch-off voltage bMWL, the WL switch-off voltage bMWL is taken as a control voltage of the gate of the first transistor. A drain of the first transistor N1 is connected to the WL, and a source of the first transistor is connected to a drain of the third transistor N3.

A gate of the second transistor N2 is connected to a first drive voltage PXIB of the WL, the first drive voltage PXIB is a WL switch-on switch and may control the gate of the second transistor N2. A drain of the second transistor N2 is connected to the WL, and a source of the second transistor is connected to the drain of the third transistor N3.

A source of the third transistor N3 is connected to a negative bias $V_{SS}$, and a gate of the third transistor is connected to the first drive voltage PXIB.

The negative bias $V_{SS}$ is input to the source of the first transistor N1 through the third transistor N3, and then is output to the WL through the source and the drain of the first transistor N1. The negative bias $V_{SS}$ is input to the source of the second transistor N2 through the third transistor N3, and then is output to the WL through the source and the drain of the second transistor N2.

A drain of the fourth transistor P1 is connected to the WL, to drive a memory array connected to the WL. A source of the fourth transistor P1 is connected to a second drive voltage PXID of the WL. A gate of the fourth transistor P1 is connected to the WL switch-off voltage bMWL, and the WL switch-off voltage bMWL is taken as a control voltage of the gate of the fourth transistor. On or off of the WL may be controlled by controlling on or off of the second drive voltage PXID.

In the embodiment of the disclosure, when the WL drive circuit is in an active mode, normally, the WL switch-off voltage bMWL is at a low potential, the second drive voltage PXID is at a high potential, the first drive voltage PXIB is at a low potential, and an output of the WL is at a high potential.

The source of the first transistor N1 and the source of the second transistor N2 are both connected to the drain of the third transistor N3, and the source of the third transistor N3 is connected to the negative bias $V_{SS}$, the gate of the third transistor is connected to the first drive voltage PXIB, i.e., the first transistor N1 and the second transistor N2 are connected to the third transistor N3 before connected to the negative bias $V_{SS}$. Therefore, in the active mode, the third transistor N3 is off, and the first transistor N1 and the second transistor N2 are in a floating state, thus the leakage current of the first transistor N1 and the second transistor N2 can be reduced.

Optionally, the first transistor N1, the second transistor N2 and the third transistor N3 are NMOS transistors, and the fourth transistor P1 is a PMOS transistor.

In the WL drive circuit provided in the embodiment of the disclosure, the source of the first transistor N1 and the source of the second transistor N2 are connected to the negative bias through the third transistor N3, rather than directly connected to the negative bias, the gate of the third transistor N3 is connected to the first drive voltage PXIB. In the active mode, the first transistor N1 is off, and the first transistor N1 and the second transistor N2 are in a floating state. In this way, the leakage current generated by the first transistor N1 and the second transistor N2 can be effectively reduced, and the power consumption of the DRAM can be reduced accordingly.

Further, based on description disclosed in the abovementioned embodiments, an embodiment of the disclosure further provides a DRAM, and the DRAM includes a WL and a WL drive circuit.

The WL drive circuit is connected to the WL and for controlling a voltage of the WL.

Specifically, the WL drive circuit is the WL drive circuit described in the above embodiments. A specific circuit structure of the WL drive circuit may refer to the descriptions in the above embodiments, and will not be elaborated again in the embodiment.

In the WL drive circuit and the DRAM provided in the embodiments of the disclosure, the WL drive circuit includes the first transistor, the second transistor, the third transistor and the fourth transistor. The gate of the first transistor is connected to the WL switch-off voltage, the drain of the first transistor is connected to the WL; the gate of the second transistor is connected to the first drive voltage of the WL, and the drain of the second transistor is connected to the WL; the source of the first transistor and the source of the second transistor are both connected to the negative bias through the third transistor. That is, in the disclosure, the source of the first transistor and the source of the second transistor are connected to the negative bias through the third transistor, rather than directly connected to the negative bias. Therefore, when the WL drive circuit is in the active mode, the leakage current generated by the first transistor and the second transistor can be effectively reduced, and the power consumption of the DRAM can be reduced accordingly.

It is finally noted that the abovementioned embodiments are used for description of the technical solutions of the disclosure only, and is not intended to limit the disclosure. Although the disclosure is described in detail with reference to the abovementioned embodiments, it should be understood by those of ordinary skill in the art that they may still modify the technical solutions disclosed in the abovementioned embodiments, or implement equivalent replacements for part or all of the technical features thereof. These modifications or replacements shall not make essence of the corresponding technical solutions deviate from the scope of the technical solutions in the embodiments of the disclosure.

The invention claimed is:

1. A Word Line (WL) drive circuit, comprising a first transistor, a second transistor, a third transistor and a fourth transistor, wherein
   a gate of the first transistor is applied with a WL switch-off voltage, and a drain of the first transistor is connected to a WL;
   a gate of the second transistor is applied with a first drive voltage of the WL, and a drain of the second transistor is connected to the WL;
   a source of the first transistor and a source of the second transistor are both connected to a negative bias end through the third transistor;
   a drain of the fourth transistor is connected to the WL, a source of the fourth transistor is applied with a second drive voltage of the WL, and a gate of the fourth transistor is applied with the WL switch-off voltage and connected with the gate of the first transistor; and
   the source of the first transistor and the source of the second transistor are both connected to a drain of the third transistor, a source of the third transistor is connected to the negative bias end, and a gate of the third transistor is applied with the first drive voltage and connected with the gate of the second transistor.

2. The WL drive circuit of claim 1, wherein when the WL drive circuit is in an active mode, the WL switch-off voltage and the first drive voltage are at a low potential, and the second drive voltage and an output voltage of the WL are at a high potential.

3. The WL drive circuit of claim 2, wherein when the gate of the third transistor is applied with the first drive voltage and the WL drive circuit is in the active mode, the third transistor is in an off state, and the first transistor and the second transistor are in a floating state.

4. The WL drive circuit of claim 1, wherein the first transistor, the second transistor and the third transistor are Negative channel Metal Oxide Semiconductor (NMOS) transistors, and the fourth transistor is a Positive channel Metal Oxide Semiconductor (PMOS) transistor.

5. A Dynamic Random Access Memory (DRAM), comprising at least one Word Line (WL) and at least one WL drive circuit, each of the at least one WL drive circuit being connected to the at least one WL and comprising a first transistor, a second transistor, a third transistor and a fourth transistor, wherein
   a gate of the first transistor is applied with a WL switch-off voltage, and a drain of the first transistor is connected to the at least one WL;
   a gate of the second transistor is applied with a first drive voltage of the at least one WL, and a drain of the second transistor is connected to the at least one WL;
   a source of the first transistor and a source of the second transistor are both connected to a negative bias end through the third transistor;
   a drain of the fourth transistor is connected to the at least one WL, a source of the fourth transistor is applied with a second drive voltage of the at least one WL, and a gate of the fourth transistor is applied with the WL switch-off voltage and connected with the gate of the first transistor; and
   the source of the first transistor and the source of the second transistor are both connected to a drain of the third transistor, a source of the third transistor is connected to the negative bias end, and a gate of the third transistor is applied with the first drive voltage and connected to the gate of the second transistor.

6. The DRAM of claim 5, wherein when the at least one WL drive circuit is in an active mode, the WL switch-off voltage and the first drive voltage are at a low potential, and the second drive voltage and an output voltage of the at least one WL are at a high potential.

7. The DRAM of claim 6, wherein when the gate of the third transistor is applied with the first drive voltage and the at least one WL drive circuit is in the active mode, the third transistor is in an off state, and the first transistor and the second transistor are in a floating state.

8. The DRAM of claim 5, wherein the first transistor, the second transistor and the third transistor are Negative channel Metal Oxide Semiconductor (NMOS) transistors, and the fourth transistor is a Positive channel Metal Oxide Semiconductor (PMOS) transistor.

9. A Word Line (WL) drive circuit, comprising a first transistor, a second transistor, a third transistor and a fourth transistor, wherein
   a gate of the first transistor is applied with a WL switch-off voltage, and a drain of the first transistor is connected to a WL;
   a gate of the second transistor is applied with a first drive voltage of the WL, and a drain of the second transistor is connected to the WL;
   a source of the first transistor and a source of the second transistor are both connected to a negative bias end through the third transistor;
   a drain of the fourth transistor is connected to the WL, a source of the fourth transistor is applied with a second drive voltage of the WL, and a gate of the fourth transistor is applied with the WL switch-off voltage and connected with the gate of the first transistor;
   the source of the first transistor and the source of the second transistor are both connected to a drain of the third transistor, and a source of the third transistor is connected to the negative bias end;
   when the WL drive circuit is in an active mode, the WL switch-off voltage and the first drive voltage are at a low potential, and the second drive voltage and an output voltage of the WL are at a high potential; and
   when a gate of the third transistor is applied with the first drive voltage and the WL drive circuit is in the active mode, the third transistor is in an off state, and the first transistor and the second transistor are in a floating state.

10. The WL drive circuit of claim 9, wherein the first transistor, the second transistor and the third transistor are Negative channel Metal Oxide Semiconductor (NMOS) transistors, and the fourth transistor is a Positive channel Metal Oxide Semiconductor (PMOS) transistor.

* * * * *